United States Patent
Barlas et al.

(10) Patent No.: US 10,985,317 B2
(45) Date of Patent: Apr. 20, 2021

(54) DEVICE FOR SELECTING A MEMORY CELL

(71) Applicant: COMMISSARIAT A L'ENERGIE ATOMIQUE ET AUX ENERGIES ALTERNATIVES, Paris (FR)

(72) Inventors: Marios Barlas, St Martin d'Heres (FR); Philippe Blaise, Grenoble (FR); Laurent Grenouillet, Claix (FR); Benoît Sklenard, Grenoble (FR); Elisa Vianello, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 216 days.

(21) Appl. No.: 16/331,729

(22) PCT Filed: Sep. 8, 2017

(86) PCT No.: PCT/EP2017/072621
§ 371 (c)(1),
(2) Date: May 28, 2019

(87) PCT Pub. No.: WO2018/046682
PCT Pub. Date: Mar. 15, 2018

(65) Prior Publication Data
US 2020/0127199 A1    Apr. 23, 2020

(30) Foreign Application Priority Data
Sep. 9, 2016 (FR) .................................... 1658444

(51) Int. Cl.
    *H01L 27/24* (2006.01)
    *H01L 45/00* (2006.01)
    *G11C 13/00* (2006.01)

(52) U.S. Cl.
    CPC ........ *H01L 45/146* (2013.01); *G11C 13/0007* (2013.01); *G11C 13/0011* (2013.01); *H01L 27/2463* (2013.01); *H01L 27/24* (2013.01); *H01L 45/00* (2013.01)

(58) Field of Classification Search
    CPC ................................ H01L 27/24; H01L 45/00
    See application file for complete search history.

(56) References Cited

U.S. PATENT DOCUMENTS

| | | | |
|---|---|---|---|
| 10,008,665 B1* | 6/2018 | Gealy | ............... H01L 27/2463 |
| 2010/0110765 A1 | 5/2010 | Tian et al. | |
| 2011/0007551 A1 | 1/2011 | Tian et al. | |

(Continued)

FOREIGN PATENT DOCUMENTS

WO    WO-2020130343 A1 *    6/2020

OTHER PUBLICATIONS

International Search Report as issued in International Patent Application No. PCT/EP2017/072621, dated Nov. 14, 2017.

*Primary Examiner* — George R Fourson, III
(74) *Attorney, Agent, or Firm* — Pillsbury Winthrop Shaw Pittman LLP

(57) ABSTRACT

A device for selecting a storage cell, includes a first electrode, a second electrode and an oxide layer disposed between the first electrode and the second electrode, wherein the oxide layer is doped with a first element from column IV of the periodic table.

13 Claims, 2 Drawing Sheets

(56) References Cited

U.S. PATENT DOCUMENTS

| | | | |
|---|---|---|---|
| 2015/0263069 A1* | 9/2015 | Jo | H01L 45/16 365/148 |
| 2015/0349251 A1 | 12/2015 | Chang et al. | |
| 2016/0012886 A1* | 1/2016 | Nazarian | G11C 13/003 365/148 |
| 2016/0064391 A1* | 3/2016 | Li | H01L 27/11507 365/145 |
| 2020/0168274 A1* | 5/2020 | Pillarisetty | G11C 13/003 |

* cited by examiner

DEVICE FOR SELECTING A MEMORY CELL

CROSS-REFERENCE TO RELATED APPLICATIONS

This application is the U.S. National Stage of PCT/EP2017/072621, filed Sep. 8, 2017, which in turn claims priority to French patent application number 1658444, filed Sep. 9, 2016. The content of these applications are incorporated herein by reference in their entireties.

TECHNICAL FIELD OF THE INVENTION

The technical field of the invention is that of non-volatile memories, and more specifically that of devices for selecting a memory cell in a matrix.

TECHNOLOGICAL BACKGROUND OF THE INVENTION

Non-volatile memories are memories that conserve information even when they are no longer supplied electrically. There exist several types of commonly used non-volatile memories, such as flash type memories. However, these memories have drawbacks such as long writing times and a low integration density. In addition, they require working at high supply voltages, of the order of 10 to 15V.

More recently, other types of non-volatile memories have appeared, based on an active material, such as CBRAM (Conductive Bridging Random Access Memory) type memories, which comprise an ionic conduction material, OxRAM (Oxide resistive Random Access Memory) type memories, which comprise a metal oxide material, and PCRAM (Phase Change Random Access Memory) type memories, which comprises a phase change material. These memories are resistive random access memories, the active material being capable of reversibly switching between a low resistance state and a high resistance state. These two resistance states thereby make it possible to encode an information bit.

Resistive random access memories have sufficiently high operating speeds to aspire to replace current non-volatile memories such as flash type memories. In addition, resistive random access memories operate at lower supply voltages. Resistive random access memories also have the interest of being able to be integrated with a high density, in particular with a crossbar type architecture. Such an architecture comprises several access lines distributed in bit lines and word lines which are perpendicular to each other. At the level of each intersection between a bit line and a word line, a memory cell is arranged between the lines. Each memory cell can thus be addressed individually by selecting the appropriate bit line and word line.

However, since all the memory cells of a bit line, and of a word line, are electrically connected to each other, it is possible to observe parasitic leakage currents passing through the memory cells adjacent to the addressed memory cell. These leakage currents can perturb the reading of the addressed memory cell up to preventing discriminating its resistance state, in particular in the unfavourable case where the adjacent memory cells are in the low resistance state.

To overcome this problem, it is known to connect in series with each memory cell a selection device making it possible to attenuate parasitic currents. The use of a transistor as selection device is widespread but increases the complexity of the integration, on the one hand because the transistor has large dimensions in comparison with those that can reach the memory cell, and on the other hand because the transistor cannot be integrated with the memory cell within the crossbar architecture. Consequently, the density and the integration capacity, notably in three dimensions, are limited.

SUMMARY OF THE INVENTION

The present invention aims to improve the integration of a device for selecting a memory cell, and more specifically a resistive non-volatile memory cell.

A first aspect of the invention thus relates to a device for selecting a resistive non-volatile memory cell, the selection device comprising a first electrode, a second electrode and an oxide layer arranged between the first electrode and the second electrode, the oxide layer being doped with an element from column IV of the periodic table.

The selection device thus has a structure enabling it to reach dimensions of the same order of magnitude as that of a memory cell and to be integrated in a crossbar architecture. In addition, the resistive behaviour of the selection device is modified by the doping of the oxide layer in such a way that the selection device has a current-voltage characteristic, that is to say a variation in the current passing through the selection device as a function of the voltage applied to the selection device, which is strongly non-linear. In particular, when the voltage is low, the current is low, and vice versa, when the voltage is high, the current is high.

Preferably, the oxide layer is entirely doped with the first element.

Preferably, the first element is present in the oxide layer at an atomic concentration comprised between 0.5% and 3%.

The oxide layer may comprise a material among the following: hafnium oxide, tantalum oxide.

Preferably, the oxide layer is doped with silicon.

A second aspect of the invention relates to an elementary cell comprising a device according to the first aspect of the invention and a resistive non-volatile memory cell connected in series with the device.

The memory cell may be a memory cell of OxRAM, CBRAM or PCRAM type.

According to a particularly advantageous embodiment, the memory cell comprises a first electrode, a second electrode and an oxide layer arranged between the first electrode and the second electrode, the memory cell and the device each having a voltage for forming a switching zone in their respective oxide layer, the oxide layer of the device being doped in such a way that the forming voltage of the device is greater than the forming voltage of the memory cell.

"Switching zone" is taken to mean a zone in which the oxide layer passes from a high resistance state to a low resistance state, this zone forming a favoured conduction path to the current passing through the selection device or the memory cell.

The selection device and the memory cell thus have similar structures. Consequently, the memory cell and the selection device may be integrated together and be produced in the same way, which facilitates manufacture. In addition, by ensuring that the forming voltage of the device is greater than the forming voltage of the memory cell, the formation of the switching zone in the oxide layer of the selection device when the elementary cell is in operation is avoided. The resistive properties of the selection device are thereby preserved.

According to a first alternative, the first element is present in the oxide layer of the device at an atomic concentration comprised between 0.5% and 2%.

According to a first alternative, the first element is present in the oxide layer of the device at an atomic concentration greater than 2%, and the oxide layer of the memory cell is doped with a second element from column IV of the periodic table in such a way that the second element is present in the oxide layer of the memory cell at an atomic concentration greater than the atomic concentration of the first element.

Preferably, the oxide layer of the memory cell and the oxide layer of the device are doped with silicon.

Advantageously, the device and the memory cell are arranged on a substrate in such a way as to form a vertical stack, the device being arranged between the memory cell and the substrate.

The oxide layer of the memory cell may comprise a material among the following: hafnium oxide, tantalum oxide, titanium oxide.

BRIEF DESCRIPTION OF THE FIGURES

The invention and its different applications will be better understood on reading the description that follows and by examining the figures that accompany it, among which.

Figure 1:
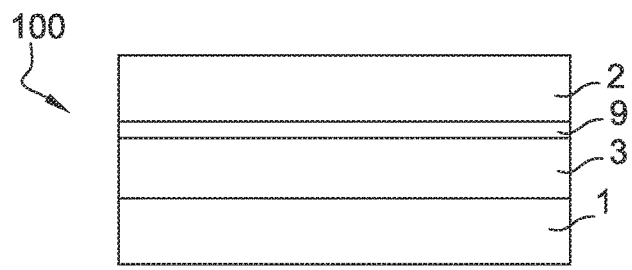
FIG. 1 schematically represents a transversal sectional view of an embodiment of a selection device according to the invention.

The figures are only presented for indicative purposes and in no way limit the invention.

For greater clarity, identical or similar elements are marked by identical reference signs in all of the figures.

DETAILED DESCRIPTION OF EMBODIMENTS OF THE INVENTION

A first aspect of the invention relates to a selection device intended to be connected in series with a memory cell, such as a resistive memory cell capable of reversibly switching between a low resistance state and a high resistance state. The change of resistance state of the memory cell corresponds to a programming operation (writing or erasing) which is carried out by applying to the memory cell a programming voltage. The memory cell may have a different programming voltage for each resistance state, notably a writing voltage different from the erasing voltage.

The change of resistance state of the memory cell may require a significant current. For example, for a memory cell of CBRAM or OxRAM type, the change of resistance state is linked to the formation and to the breaking of a switching zone that forms a favoured conduction path to the current passing through the memory cell when said cell is in the low resistance state. The higher the current that passes through the switching zone, the more difficult it is to break the switching zone. The selection device must thus allow sufficient current to pass to enable the current passing through the switching zone to leak and thereby facilitate the breaking of the switching zone. Generally speaking, the selection device must allow sufficient current to pass to enable the change of resistance state of the memory cell.

The determination of the resistance state in which the memory cell is found corresponds to a reading operation which is carried out by applying to the memory cell a reading voltage.

The memory cell may belong to a memory matrix having for example a crossbar type architecture which comprises bit lines and word lines perpendicular to each other, a memory cell being arranged at each intersection between a bit line and a word line. A memory cell is addressed in writing (respectively in erasing) or in reading by applying the writing voltage (respectively the erasing voltage) or the reading voltage between the appropriate bit line and the word line.

Ideally, during a reading operation, a current only passes through the addressed memory cell. However, leakage currents can pass through memory cells adjacent to the addressed memory cell. Indeed, the memory cells arranged on the selected bit line are subjected to part, for example half, of the reading voltage. The same is true for the memory cells arranged on the selected word line. The leakage currents may be added to the current passing through the addressed memory cell and thereby falsify the determination of the resistance state of the addressed memory cell. The selection device thus has to isolate the memory cells that are not addressed in order to attenuate the leakage currents.

To summarise, the selection device is designed in such a way that, over a voltage range including the operating voltages (writing, erasing and reading), the current passing through the selection device is high, and that, for voltages below this voltage range, the current passing through the selection device is low.

In the remainder of the description, the terms "high" and "low", when they characterise a voltage, are used to designate a voltage belonging respectively to the voltage range including the operating voltages, and a voltage below this range.

FIG. 1 shows an embodiment of a selection device 100 according to the invention which satisfies the characteristics described previously. The selection device 100 comprises a first electrode 1, a second electrode 2 and an oxide layer 3 arranged between the first electrode 1 and the second electrode 2.

The electrodes 1, 2 are electrically conductive layers and may comprise one or more conductive materials such as titanium nitride, doped silicon, tungsten, tungsten nitride, metal silicides, platinum. The electrodes 1, 2 have a thickness preferably comprised between 5 nm and 30 nm.

The oxide layer 3 preferably comprises an oxide of a transition metal such as hafnium oxide, tantalum oxide, titanium oxide, zirconium oxide or niobium oxide. Optionally, the oxide layer 3 may comprise several superimposed oxide sub-layers. The oxide layer 3 has a thickness preferably comprised between 3 nm and 20 nm, and even more preferentially comprised between 5 nm and 10 nm.

The oxide layer 3 is doped with an element from column IV of the periodic table, such as carbon, silicon, germanium or tin which belong to column IVA, or such as titanium, zirconium or hafnium which belong to column IVB. This doping makes it possible to modify the resistivity properties of the selection device in order to obtain a non-linear behaviour of the response curve of the current passing through the selection device as a function of the voltage applied to the memory cell. This behaviour notably includes a low current for a low voltage, the selection device 100 then having a high resistance value, and a high current for a high voltage, the selection device 100 then having a low resistance value.

Preferably, the whole of the oxide layer 3 of the selection device is doped with the element from column IV. The atomic concentration of this element is advantageously uniform within the oxide layer 3.

Figure 2:
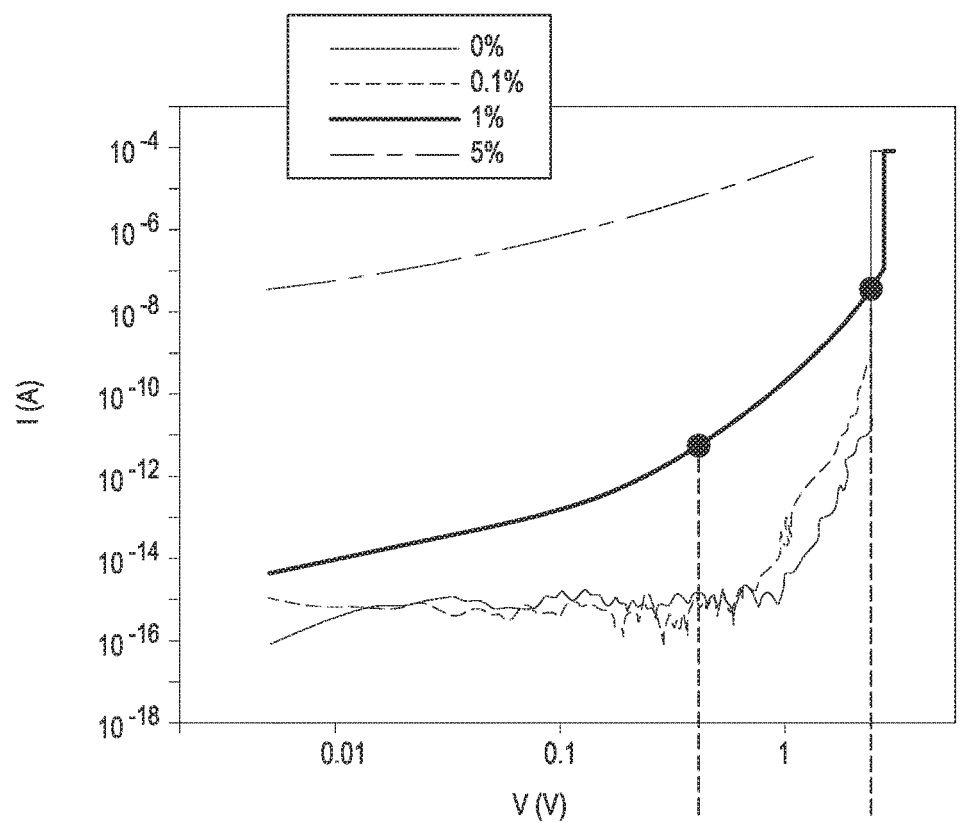
FIG. 2 represents the current-voltage characteristics of the selection device of FIG. 1 which comprises a hafnium oxide layer of 10 nm thickness doped with silicon, for different values of atomic concentration of silicon in the hafnium oxide layer.

FIG. 2 shows current-voltage characteristics for an example of selection device 100 comprising a hafnium oxide layer of 10 nm thickness doped with silicon. The current-voltage characteristics are represented for different values of atomic concentration of silicon in the hafnium oxide layer.

Throughout the description and in the claims, the atomic concentration C of the doping element in the oxide layer 3 is expressed in percentage and is defined by the following relationship:

$$C = 100 * \frac{C_{dopant}}{C_{Ox} + C_{dopant}}$$

where $C_{dopant}$ is the concentration of atoms of the doping element present in the oxide layer 3, and $C_{ox}$ is the concentration of atoms constituting the non-doped oxide layer 3, these concentrations $C_{dopant}$ and $C_{ox}$ being expressed in number of atoms per $cm^{-3}$.

It may be observed in FIG. 2 that when the atomic concentration of silicon in the oxide layer 3 is too low, for example of the order of 0.1%, the current-voltage characteristic is substantially identical to the case where the oxide layer 3 is not doped. In this case, the current-voltage characteristic is strongly non-linear but the selection device 100 does not allow sufficient current to pass to make it possible to read or to switch the resistance state of the memory cell.

Conversely, when the atomic concentration of silicon in the oxide layer 3 is too high, for example of the order of 5%, the current-voltage characteristic becomes substantially linear. In addition, the selection device 100 is no longer sufficiently isolating even when the voltage is low, the current then being too high.

A satisfactory current-voltage characteristic is advantageously obtained when the atomic concentration of silicon in the oxide layer 3 is comprised between 0.5% and 3%, for example of the order of 1%. Indeed, this characteristic has a strong non-linearity over a voltage range 201 sufficiently extended to include the operating voltages of the memory cell. In addition, when the voltage is low, the current is low. In this case, the selection device 100 may for example have a non-linearity factor comprised between 100 and 5000.

The atomic concentration of the doping element in the oxide layer is thus preferably comprised between 0.5% and 3%, and even more preferentially comprised between 1% and 2%.

The doping of the oxide layer 3 is preferably obtained by ion implantation which is a well-controlled method, which makes it possible to obtain with precision the desired atomic concentration of the element in the oxide layer 3.

The selection device 100 may advantageously be manufactured using only materials that are compatible not just with end-of-line production integration but also start-of-line production integration. This is the case for example of a particular embodiment in which the electrodes 1, 2 of the selection device are made of titanium nitride, the oxide layer 3 of the selection device is made of hafnium oxide and is doped with silicon.

A second aspect of the invention relates to an elementary cell comprising a selection device such as described previously and a resistive memory cell connected in series with the selection device. A multitude of such elementary cells may be laid out in lines and columns to form a memory matrix having for example a crossbar type architecture.

The resistive memory cell may for example be a CBRAM, OxRAM, PCRAM or STT-RAM memory cell. Generally speaking, it may be any memory cell that is alternatively addressed or isolated, and which in operation is passed through by a current which it is necessary to limit.

Figure 3:
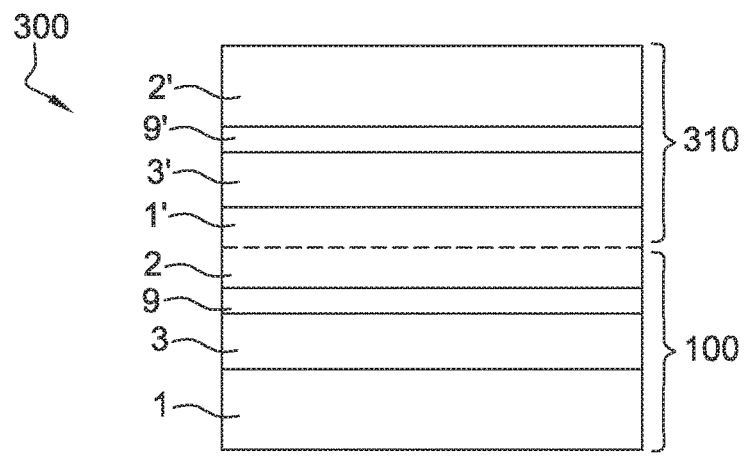
FIG. 3 schematically represents a transversal sectional view of an embodiment of an elementary cell according to the invention, the elementary cell comprising the selection device of FIG. 1.

FIG. 3 shows a particularly advantageous embodiment of an elementary cell 300 according to the invention in which the memory cell 310 has a structure similar to that of the selection device 100. The memory cell 310 comprises an oxide layer 3' arranged between a first electrode 1' and a second electrode 2'. Consequently, the memory cell and the selection device may be integrated together and produced by means of similar methods.

The electrodes 1', 2' of the memory cell 310 are electrically conductive layers and may comprise one or more conductive materials such as titanium nitride, doped silicon, tungsten, tungsten nitride, metal silicides, platinum. The electrodes 1', 2' have a thickness preferably comprised between 5 nm and 30 nm.

The oxide layer 3' of the memory cell 310 preferably comprises an oxide of a transition metal such as hafnium oxide, tantalum oxide, titanium oxide, zirconium oxide or niobium oxide. Optionally, the oxide layer 3' may comprise several superimposed oxide sub-layers. The oxide layer 3' has a thickness preferably comprised between 3 nm and 20 nm, and even more preferentially comprised between 5 nm and 10 nm.

In the embodiment illustrated in FIG. 3, the electrodes 1, 2 of the selection device 100 and the electrodes 1', 2' of the memory cell 310 are made of titanium nitride, the oxide layer 3 of the selection device 100 and the oxide layer 3' of the memory cell 310 are made of hafnium oxide. Thus, the manufacture of the elementary cell 300 is simplified by the use of identical materials to produce the selection device 100 and the memory cell 310.

The memory cell 310 can reversibly switch between a low resistance state and a high resistance state which correspond to the formation and to the breaking of a conductive switching zone in the oxide layer 3'. When the memory cell 310 is in its original state, just after the manufacture thereof, the switching zone is formed for the first time by applying to the memory cell 310 a first forming voltage. Next, the memory cell 310 enters into a normal operating mode in which a writing voltage and an erasing voltage are used respectively to form and break the switching zone, and thereby change the resistance state of the memory cell 310. The resistance state in which is found the memory cell 310 may be determined by applying thereto a reading voltage. The writing, erasing and reading voltages of the memory cell 310 are in absolute values less than the first forming voltage.

On the same principle, the selection device 100, which has a structure similar to that of the memory cell 310, has a second voltage for forming a switching zone in the oxide layer 3. In order that the selection device 100 conserves its resistive properties and continues to function as selection device, and not as a memory cell, it is necessary to avoid formation of the switching zone. To do so, the voltage applied to the selection device 100 is kept below the second forming voltage. The first forming voltage of the memory cell 310 is thus less than the second forming voltage of the selection device 100. To do so, preferably the doping of the oxide layer 3 of the selection device 100 is adjusted.

The fact of doping the oxide layer of such structures with an element from column IV of the periodic table modifies the forming voltage of the switching zone in this layer. Several alternatives of the embodiment of the FIG. 3 are thus possible, the oxide layer 3' of the memory cell 310 also being able to be doped with a second element from column IV of the periodic table. The second element may be identical or different to the element doping the oxide layer 3 of the selection device 100. In the embodiment illustrated in FIG. 3, silicon is used to dope the oxide layers 3, 3' of the selection device 100 and the memory cell 310.

The doping of the oxide layer 3, 3' with an element from column IV of the periodic table modifies the forming voltage in the following manner. The forming voltage when the atomic concentration of the doping element is zero, that is to say when the oxide layer 3, 3' is not doped, is taken as reference voltage. When the doping of the oxide layer 3, 3' starts, the forming voltage increases with atomic concentration until reaching a maximum value. Next, when the atomic concentration continues to increase, the forming voltage decreases, passing below the reference voltage.

Figure 4:
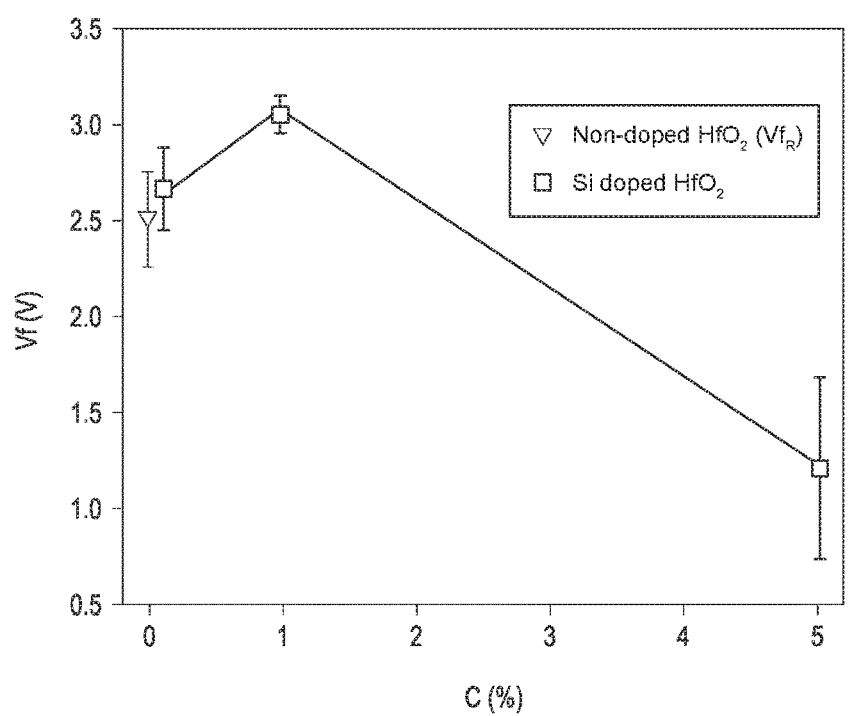
FIG. 4 shows the variation in the voltage for forming a switching zone in a hafnium oxide layer as a function of the atomic concentration, expressed in percentage, of silicon present in the hafnium oxide layer.

This phenomenon is for example illustrated on the curve of FIG. 4 which presents the variation in the forming voltage $V_f$ measured in the hafnium oxide as a function of the atomic concentration C of silicon present in the hafnium oxide. In this example, the forming voltage $V_f$ is greater than the reference voltage $V_f$ when the concentration C of silicon is comprised between 0.1% and 2%, and the maximum value of the forming voltage $V_f$ seems to be reached for a concentration C of silicon of the order of 1%. Conversely, the forming voltage $V_f$ is less than the reference voltage $V_f$ when the concentration C of silicon is greater than 2%.

In a first alternative of the elementary cell 300, the atomic concentration of silicon in the oxide layer 3 of the selection device 100 is comprised between 0.5% and 2%, and the oxide layer 3' is not doped. Thus, a single implantation step may suffice during the manufacture of the elementary cell 300.

In a second alternative of the elementary cell 300, the atomic concentration of silicon in the oxide layer 3 of the selection device 100 is greater than 2%, and the oxide layer 3' of the memory cell 310 is doped in such a way as to have an atomic concentration of silicon greater than the atomic concentration of silicon in the oxide layer 3 of the selection device 100.

In the alternatives described previously, the oxide layers 3, 3' of the selection device 100 and memory cell 310 have identical thicknesses. It is also possible to adjust the voltages for forming the selection device 100 and memory cell 310 by modifying the thickness of the oxide layers 3, 3'. The greater the thickness of an oxide layer, the higher the forming voltage.

The fact that the first forming voltage of the memory cell 310 is less than the second forming voltage of the selection device 100 may be generalised to other types of memory cells. Thus, the highest operating voltage of a memory cell is less than the forming voltage of the switching zone in the oxide layer of the selection device associated with this memory cell.

In OxRam type memory cells, an explanation for the formation of the switching zone is the accumulation of oxygen vacancies within the oxide layer 3'. Advantageously, the memory cell 310 may comprise a layer 9' formed with a material having a strong affinity with oxygen, this layer thereby forming a reservoir of oxygen vacancies which facilitates the formation of the switching zone by providing the necessary vacancies. The reservoir layer 9' is for example arranged between the oxide layer 3' and the second electrode 2' of the memory cell 310.

Similarly, the selection device 100 may advantageously comprise a layer 9 formed with a material having a strong affinity with oxygen, this layer thereby forming a reservoir of oxygen vacancies. In this case, even before the formation of the switching zone, the reservoir layer 9 provides oxygen vacancies which makes it possible to increase the values of the current passing through the selection device 100 during operation. The reservoir layer 9 is for example arranged between the oxide layer 3 and the second electrode 2 of the selection device 100, as illustrated in FIGS. 1 and 3.

The reservoir layers 9, 9' have a thickness preferably comprised between 2 nm and 10 nm, and even more preferentially comprised between 3 nm and 7 nm. The reservoir layers 9, 9' comprise for example titanium, zirconium, hafnium or lanthanum.

The selection device 100 and the memory cell 310 are arranged on the surface of a substrate (not represented), for example made of silicon, being able to comprise other layers already formed above. Preferably, the different constituent layers of the selection device 100 and the memory cell 310 form a vertical stack with respect to the surface of the substrate. The selection device 100 and the memory cell 310 may thereby have a common electrode arranged between the two oxide layers 3, 3'.

In the embodiment illustrated in FIG. 3, the selection device 100 is arranged between the memory cell 310 and the substrate. The oxide layer 3 of the selection device 100 is thereby situated at greater depth than the oxide layer 3' of the memory cell 310. In this way, it is possible to dope both the oxide layer 3 of the selection device 100 and the oxide layer 3' of the memory cell 310 in two successive implantations. The desired doping profile may be obtained by carrying out a first implantation at a high energy, for example comprised between 25 keV and 40 keV, in order to dope simultaneously the two oxide layers 3, 3', and a second implantation at a low energy, for example comprised between 2 keV and 7 keV, in order to dope only the oxide layer 3' of the memory cell 310. The oxide layer 3' of the memory cell 310 then cumulates the dopants of the first implantation and the second implantation, and the result is that its atomic concentration of dopants is greater than that of the oxide layer 3 of the selection device 100.

Naturally, the invention is not limited to the embodiments described with reference to the figures and alternatives could be envisaged without going beyond the scope of the invention.

In an alternative embodiment of the elementary cell in which the selection device and the memory cell also form a vertical stack with respect to the surface of the substrate, the memory cell may be arranged between the selection device and the substrate.

Alternatively, the different constituent layers of the selection device and the memory cell may form a horizontal stack with respect to the surface of the substrate. The selection device and the memory cell are then one beside the other. The electrode common to the selection device and to the memory cell is thereby more easily accessible. This electrode may be used to polarise independently the selection device and the memory cell, for example to guarantee that the voltage applied to the selection device remains less than its forming voltage.

The invention claimed is:

1. A device for selecting a memory cell, the device comprising a first electrode, a second electrode and an oxide layer arranged between the first electrode and the second electrode, wherein the oxide layer is doped with a first element from column IVA of the periodic table.

2. The device according to claim 1, wherein the oxide layer is entirely doped with the first element.

3. The device according to claim 1, wherein the first element is present in the oxide layer at an atomic concentration comprised between 0.5% and 3%.

4. The device according to claim 1, wherein the oxide layer comprises a material among the following: hafnium oxide, tantalum oxide.

5. The device according to claim 1, wherein the oxide layer is doped with silicon.

6. An elementary cell comprising a device according to claim 1 and a resistive non-volatile memory cell connected in series with the device.

7. The elementary cell according to claim 6, wherein the memory cell is a memory cell of OxRAM, CBRAM or PCRAM type.

8. The elementary cell according to claim 5, wherein the memory cell comprises a first electrode, a second electrode and an oxide layer arranged between the first electrode and the second electrode, the memory cell and the device each having a voltage for forming a switching zone in their respective oxide layer, the oxide layer of the device being doped in such a way that the forming voltage of the device is greater than the forming voltage of the memory cell.

9. The elementary cell according to claim 8, wherein the first element is present in the oxide layer of the device at an atomic concentration comprised between 0.5% and 2%.

10. The elementary cell according to claim 8, wherein the first element is present in the oxide layer of the device at an atomic concentration greater than 2%, and wherein the oxide layer of the memory cell is doped with a second element from column IV of the periodic table in such a way that the second element is present in the oxide layer of the memory cell at an atomic concentration greater than the atomic concentration of the first element.

11. The elementary cell according to claim 10, wherein the oxide layer of the memory cell and the oxide layer of the device are doped with silicon.

12. The elementary cell according to claim 8, wherein the device and the memory cell are arranged on a substrate in such a way as to form a vertical stack, the device being arranged between the memory cell and the substrate.

13. The elementary cell according to claim 8, wherein the oxide layer of the memory cell comprises a material among the following: hafnium oxide, tantalum oxide, titanium oxide.

* * * * *